United States Patent
Satomi

(10) Patent No.: US 7,778,034 B2
(45) Date of Patent: Aug. 17, 2010

(54) POWER AMPLIFICATION DEVICE AND TRANSMITTER USING IT

(75) Inventor: Akihiro Satomi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/352,787

(22) Filed: Jan. 13, 2009

(65) Prior Publication Data
US 2009/0213554 A1 Aug. 27, 2009

(30) Foreign Application Priority Data
Feb. 22, 2008 (JP) ............... 2008-041370

(51) Int. Cl.
*H05K 7/20* (2006.01)
*H04B 1/03* (2006.01)

(52) U.S. Cl. .............. 361/704; 361/707; 361/709; 361/714; 361/716; 361/814; 165/185

(58) Field of Classification Search ................. 361/704, 361/707, 709, 714, 716; 165/185; 330/66, 330/124 R, 126, 295
See application file for complete search history.

(56) References Cited

FOREIGN PATENT DOCUMENTS

| JP | 57-125505 | 8/1982 |
|---|---|---|
| JP | 59-194524 | 11/1984 |
| JP | 63-157514 | 6/1988 |
| JP | 63-102318 | 7/1988 |
| JP | 63-158905 | 7/1988 |
| JP | 9-27507 | 1/1997 |
| JP | 9-275350 | 10/1997 |
| JP | 2002261644 A * | 9/2002 |
| JP | 2003-283257 | 10/2003 |

OTHER PUBLICATIONS

EPO Communication for EPP101718, issued on Apr. 7, 2010.

* cited by examiner

*Primary Examiner*—Jayprakash N Gandhi
*Assistant Examiner*—Robert J Hoffberg
(74) *Attorney, Agent, or Firm*—Oblon, Spivak, McClelland, Maier & Neustadt, L.L.P.

(57) ABSTRACT

A power amplification device includes a first power amplification unit having the positions of connectors thereof reversed, a second power amplification unit not having the positions of connectors thereof reversed, and a heat sink having a first flank thereof abutted on the heat radiation surface of the first power amplification unit, and having a second flank abutted on the heat radiation surface of the second power amplification unit. A transmitter using the power amplification device includes a plurality of power amplification devices, a distributor directly coupled to the input connectors of the power amplification devices, and a synthesizer directly coupled to the output connectors of the power amplification devices.

4 Claims, 5 Drawing Sheets

US 7,778,034 B2

POWER AMPLIFICATION DEVICE AND TRANSMITTER USING IT

CROSS-REFERENCE TO RELATED APPLICATIONS

This application is based upon and claims the benefit of priority from the prior Japanese Patent Application No. 2008-41370, filed on 22 Feb. 2008, the entire contents of which are incorporated herein by reference.

TECHNICAL FIELD

The present invention relates to a power amplification device making it possible to simplify a connecting mechanism for a distributor and a synthesizer, and a transmitter using the power amplification device.

BACKGROUND

A solid-state transmitter that is a transmitter using a semiconductor is characteristic of a small output per unit. Therefore, multiple solid-state transmitters are used in combination in order to provide a desired output power.

However, when multiple solid-state transmitters are combined, a transmitter body gets larger.

From this viewpoint, a technology for decreasing the size of the transmitter body by arranging the solid-state transmitters on the front side of a housing and the rear side thereof has been proposed (refer to, for example, JP-A-9-275350).

However, the above technology has failed to fully downsize the housing. This is attributable to the complexity in the connecting structure for use in connecting the solid-state transmitters to a distributor and a synthesizer alike.

FIG. 4A to FIG. 4C show a conventional power amplification unit 10A. FIG. 4A is a front view of the conventional power amplification unit 10A, FIG. 4B is a bottom view of an assembly of the conventional power amplification units 10A, and FIG. 4C is a back view of the conventional power amplification unit 10A.

As shown in FIG. 4A to FIG. 4C, the conventional power amplification unit 10A has an input connector 14 located by the side of an input terminal 13A, and has an output connector 15 located by the side of an output terminal 12A.

When a heat sink 16 is abutted on the heat radiation surfaces of the power amplification units 10A, one input connector 14 and one output connector 15 are, as shown in FIG. 4B, disposed on the right and left side of the assembly of the power amplification units.

FIG. 5 is a bottom view of a transmitter using the conventional power amplification unit 10A. As shown in FIG. 5, an input line 31 led from a distributor 22A and an output line 32 fed to a synthesizer 21A intersect each other. Since this wiring is needed, a space for the wirings has to be preserved. This wiring hinders downsizing of the transmitter body.

SUMMARY

In an aspect of the present invention, the power amplification device includes: a first power amplification unit including a first power amplifier whose heat radiation surface, input terminal, and output terminal have a certain positional relationship, a first input connector disposed by the side of the first output terminal of the first power amplifier, a first output connector disposed by the side of the first input terminal of the first power amplifier, a first output lead that connects the first output terminal and first output connector, and a first input lead that connects the first input terminal and first input connector; a second power amplification unit including a second power amplifier whose heat radiation surface, input terminal, and output terminal have the same positional relationship as that of the first power amplifier, a second output connector disposed by the side of the second output terminal of the second power amplifier, a second input connector disposed by the side of the second input terminal of the second power amplifier, a second output lead that connects the second output terminal and second output connector, and a second input lead that connects the second input terminal and second input connector; and a heat sink that has a first flank thereof abutted on the heat radiation surface of the first power amplification unit and has a second flank thereof abutted on the heat radiation surface of the second power amplification unit.

DETAILED DESCRIPTION

Figure 1A:
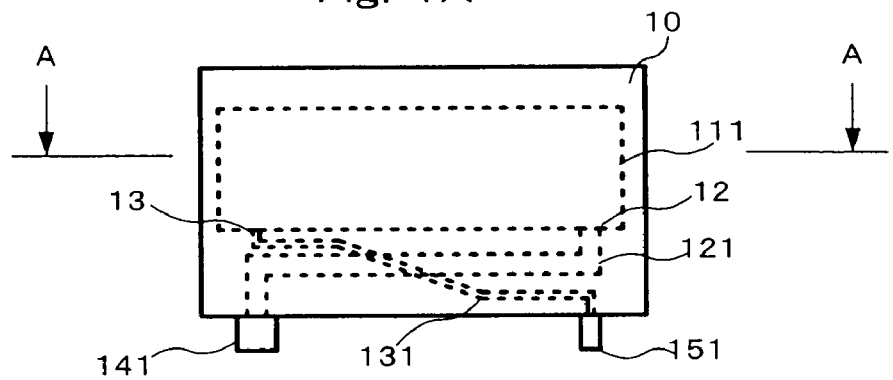
FIG. 1A is a front view of a first power amplification unit.

Throughout this description, the embodiments and examples shown should be considered as exemplars, rather than limitations on the apparatus and methods of the present invention.

Referring to the drawings, an embodiment of a power amplification device in accordance with the present invention and a transmitter using the power amplification device will be described below. In the drawings, the same reference numerals are assigned to the same components. An iterative description will be omitted.

Figure 1B:
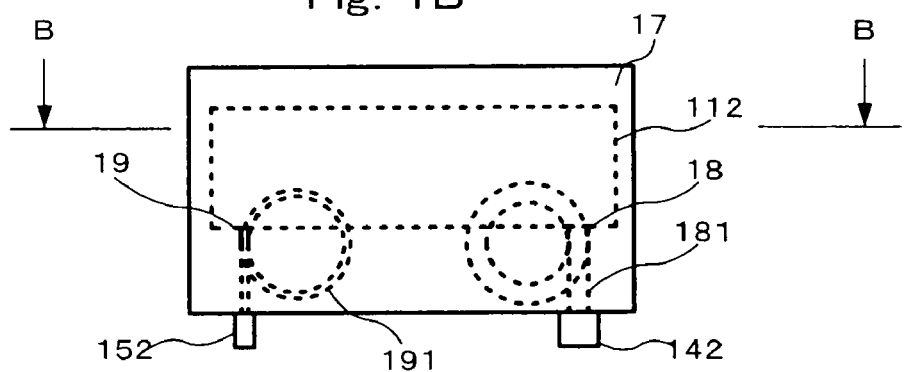
FIG. 1B is a front view of a second power amplification unit.
Figure 1C:
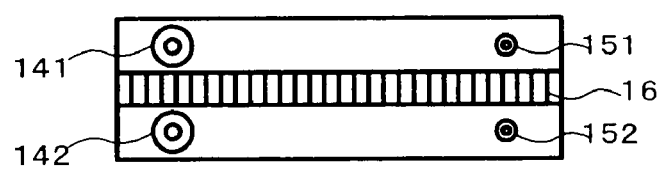
FIG. 1C is a bottom view of a power amplification device.
Figure 1D:
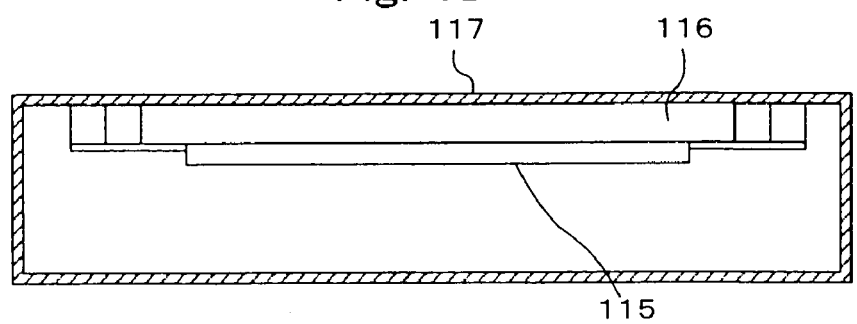
FIG. 1D is an A-A sectional view of the power amplification unit shown in FIG. 1A.

FIG. 1A to FIG. 1D show a power amplification device 1 of the present embodiment. FIG. 1A is a front view of a first power amplification unit 10. FIG. 1B is a front view of a second power amplification unit 17. FIG. 1C is a bottom view of the power amplification device 1. FIG. 1D is an A-A sectional view of the power amplification unit shown in FIG. 1A.

As shown in FIG. 1A to FIG. 1C, the power amplification device 1 includes the first power amplification unit 10, the second power amplification unit 17, and a heat sink 16.

The first power amplification unit 10 has an input connector 151 disposed by the side of an output terminal 12 of a first power amplifier 111, and has an output connector 141 disposed by the side of an input terminal 13 of the first power amplifier 111.

In the first power amplification unit 10, a first input cable 131 connecting the input terminal 13 and input connector 151 intersects a first output cable 121 connecting the output terminal 12 and output connector 141.

The second power amplification unit 17 has an output connector 142 disposed by the side of an output terminal 18 of a second power amplifier 112, and has an input connector 152 by the side of an input terminal 19 of the second power amplifier 112.

In the second power amplification unit 17, a second input cable 191 connecting the input terminal 19 and input connector 152 does not intersect a second output cable 181 connecting the output terminal 18 and output connector 142.

Preferably, the first power amplifier 111 and second power amplifier 112 are identical to each other so that the output signals thereof will be in phase with each other.

The first input cable 131 and second input cable 191 have nearly the same length so that the input signals of the first and second power amplifiers will be in phase with each other. If a phase shifter is connected on the second input cable 191, the first input cable 131 and second input cable 191 may have mutually different lengths.

The first output cable 121 and second output cable 181 have nearly the same length so that the output signals of the first and second power amplifiers will be in phase with each other. If a phase shifter is connected on the second output cable 181, the first output cable 121 and second output cable 181 may have mutually different lengths.

In the present embodiment, for power amplification, the phases of signals passing through the first power amplification unit 10 and the second power amplification unit 17 have to be equal to each other. The first power amplifier 111 and the second power amplifier 112 are realized with identical power amplifiers, the phases of signals passing over the first input cable 131 and the second input cable 191 are squared with each other, and the phases of signals passing over the first output cable 121 and the second output cable 181 are squared with each other, whereby the phases of signals passing through the first power amplification unit 10 and the second power amplification unit 17 become equal to each other.

The heat sink 16 has the first flank thereof abutted on the heat radiation surface of the first power amplification unit 10, and has the second flank thereof abutted on the heat radiation surface of the second power amplification unit 17.

As shown in FIG. 1C, on the bottom of the power amplification device 1, the input connector 151 of the first power amplification unit 10 and the input connector 152 of the second power amplification unit 17 are disposed by the side of the right flank of the power amplification device 1. The output connector 141 of the first power amplification unit 10 and the output connector 142 of the second power amplification unit 17 are disposed by the side of the left flank of the power amplification device 1 opposed to the right flank thereof.

As shown in FIG. 1D, the first power amplification unit 10 has the first power amplifier 111 incorporated in a housing thereof. The first power amplifier 111 has a power amplification circuit 115 and a heat radiation panel 116. The heat radiation panel 116 is in contact with the heat radiation surface 117.

Heat generated by the power amplification circuit 115 is transmitted to the heat radiation panel 116, transmitted to the heat sink 16 through the heat radiation surface 117, and radiated from the heat sink 16.

A B-B sectional view of the second power amplification unit 17 shown in FIG. 1B is the vertical reverse of the one of FIG. 1D.

Figure 2:
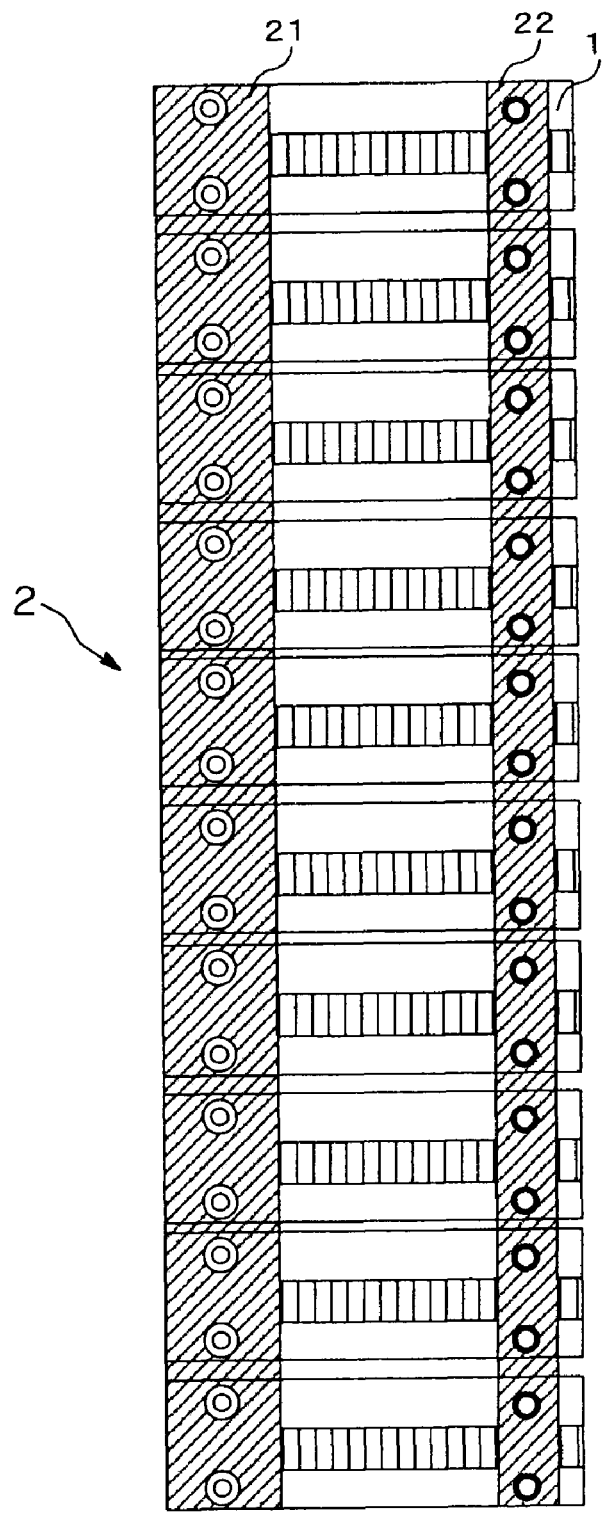
FIG. 2 is a bottom view of a transmitter using the power amplification device of an embodiment of the present invention.

FIG. 2 is a bottom view of a transmitter 2 using the power amplification device 1 of the present embodiment. As shown in FIG. 2, the transmitter 2 includes multiple power amplification devices 1, a distributor 22 directly coupled to the input connectors of the multiple power amplification devices 1, and a synthesizer 21 directly coupled to the output connectors of the multiple power amplification devices 1.

The multiple power amplification devices 1 are directly connected to the distributor 22 and synthesizer 21 through the connectors without use of any cable.

Figure 3:
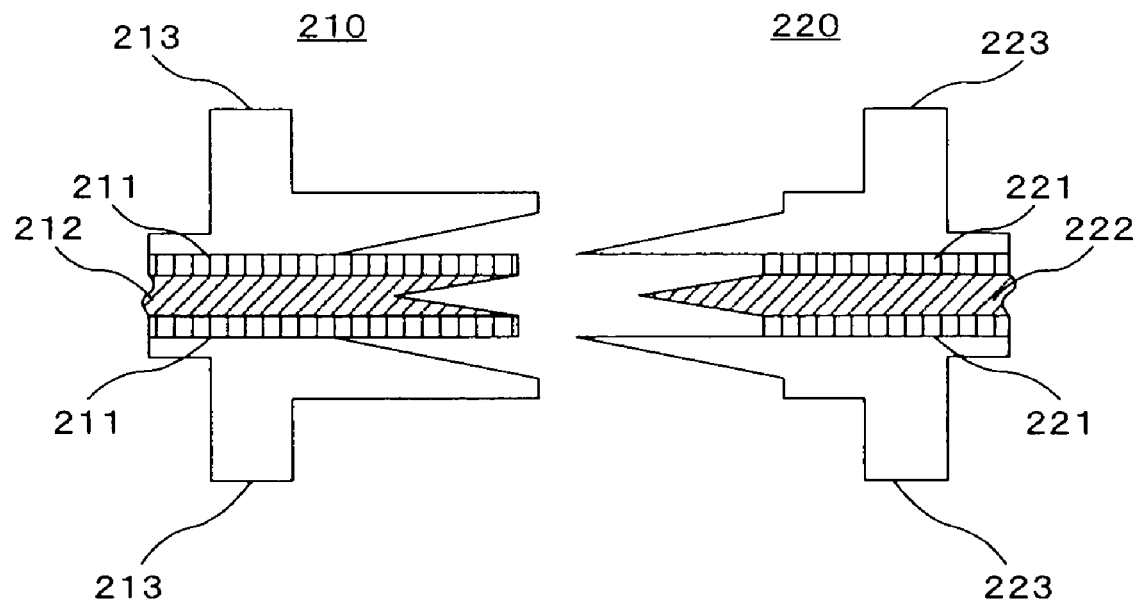
FIG. 3 is a sectional view of connectors employed in the embodiment.
Figure 4A:
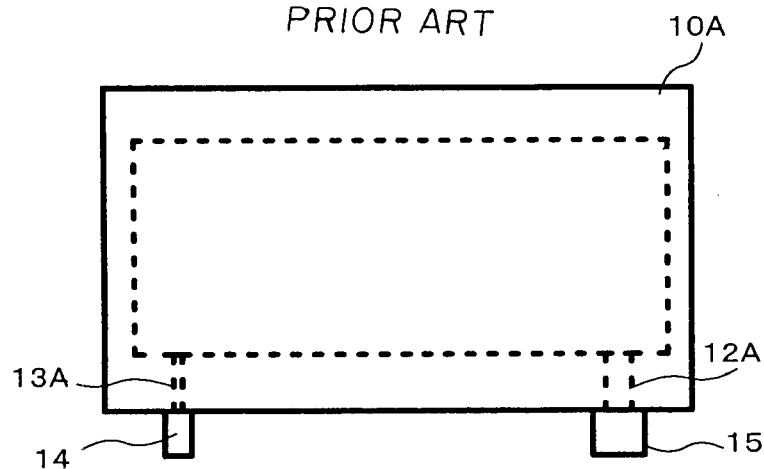
FIG. 4A is a front view of a conventional power amplification unit.
Figure 4B:
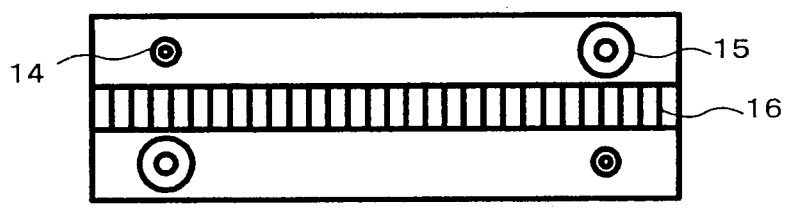
FIG. 4B is a bottom view of an assembly of the conventional power amplification units.
Figure 4C:
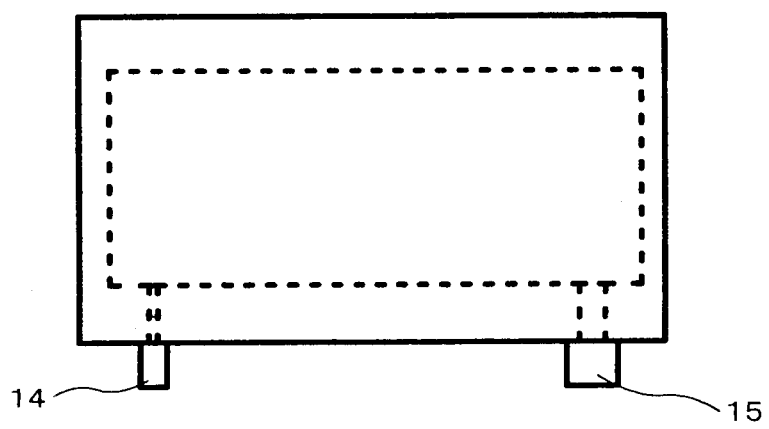
FIG. 4C is a back view of the conventional power amplification unit.
Figure 5:
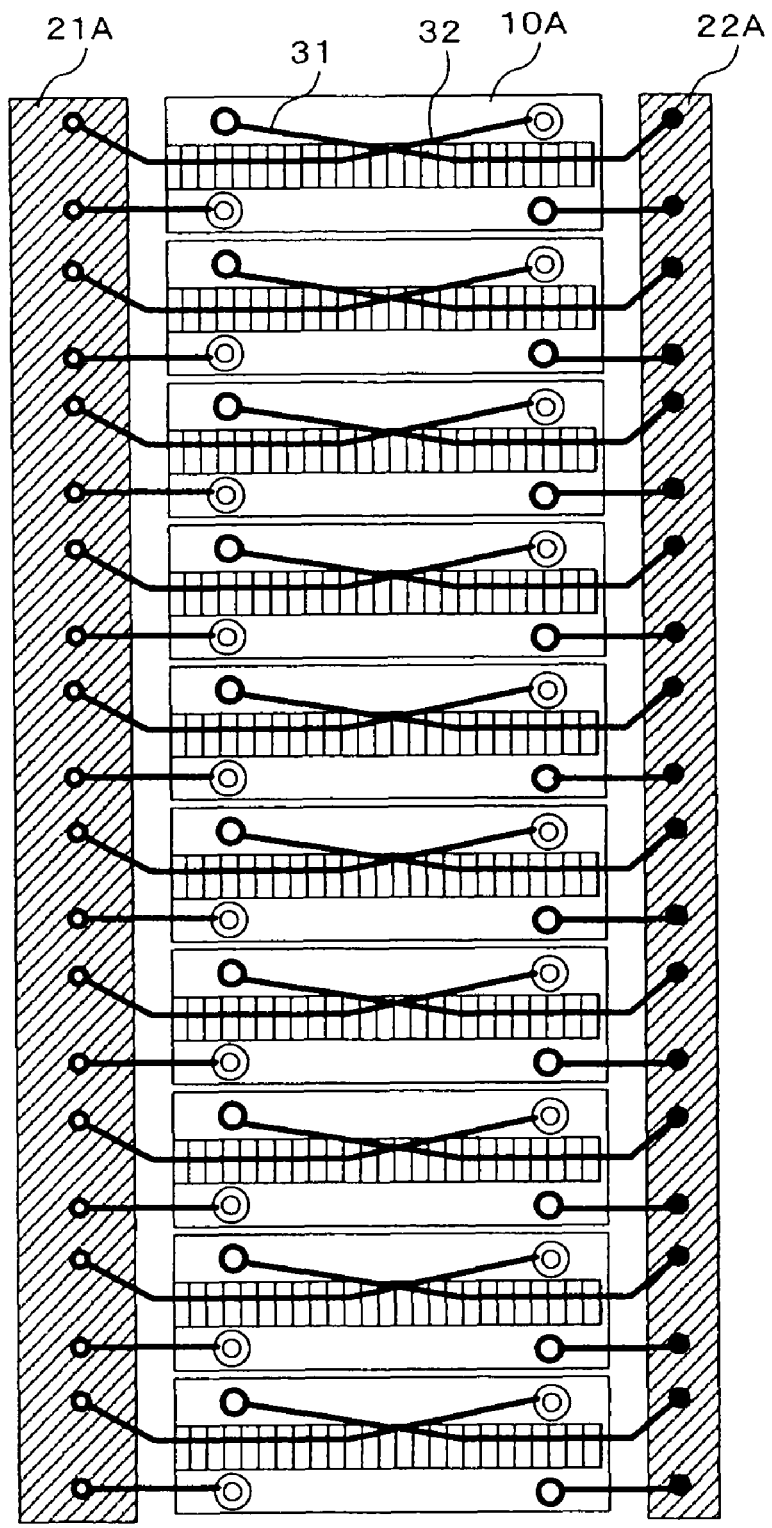
FIG. 5 is a bottom view of a transmitter using the conventional power amplification unit.

FIG. 3 is a sectional view of connectors employed in the present embodiment. As shown in FIG. 3, the connectors include a female connector 210 and a male connector 220.

The female connector 210 is shielded with a dielectric 211, and includes a female center conductor 212 that has a notch, of which section is shaped like a letter V, formed at the end thereof, and a metallic female joint body 213 that is formed outside the dielectric 211 and has a notch, of which section is shaped like a letter V, formed therein.

The male connector 220 is shielded with a dielectric 221, and includes a male center conductor 222 having the end part thereof sharpened so that the section of the end part will be shaped like a letter V, and a metallic male joint body 223 that is formed outside the dielectric 221 and has the end part thereof sharpened so that the section of the end part will be shaped like a letter V.

The female connector 210 is attached to the power amplification device 1, and the male connector 220 is attached to each of the synthesizer 21 and distributor 22. For connection of the power amplification device 1 to the distributor 22 and synthesizer 21 alike, the male connector 220 is fitted into the female connector 210. Thus, the power amplification device is directly connected to the distributor 22 and synthesizer 21 alike without use of a cable.

As mentioned above, the power amplification device 1 of the present embodiment includes the first power amplification unit 10 having the positions of the connectors thereof reversed, the second power amplification unit 17 that does not have the positions of the connectors thereof reversed, and the heat sink 16 having the first flank thereof abutted on the heat radiation surface of the first power amplification unit 10 and having the second flank thereof abutted on the heat radiation surface of the second power amplification unit 17. The transmitter 2 using the power amplification device 1 includes the multiple power amplification devices 1, the distributor 22 directly coupled to the input connectors 151 and 152 of the multiple power amplification devices 1, and the synthesizer 21 directly coupled to the output connectors 141 and 142 of the multiple power amplification devices 1.

The connection wiring among the power amplification device 1, distributor 22, and synthesizer 21 can be simplified, and downsizing and reduction in a cost can be achieved. In addition, since a connecting part need not be used, a loss caused by radiofrequency amplification can be decreased and performance can be improved.

The present invention is not limited to the foregoing embodiment. Any of the components of the present invention can be modified without a departure from the gist of the invention. The components disclosed in the embodiment may be appropriately combined in order to constitute various inventions. For example, some of the components included in the embodiment may be excluded. Further, the components of different embodiments may be appropriately combined.

Although exemplary embodiments of the present invention have been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. A power amplification device comprising:

a first power amplification unit including a first power amplifier having a first heat radiation surface, a first input terminal, and a first output terminal having a certain positional relationship, a first input connector disposed adjacent to the first output terminal of the first power amplifier, the first output connector disposed adjacent to the first input terminal of the first power amplifier, a first output lead connecting the first output terminal and the first output connector, and a first input lead connecting the first input terminal and the first input connector;

a second power amplification unit including a second power amplifier having a second heat radiation surface, a second input terminal, and a second output terminal having the same positional relationship as the first radiation surface, the first input terminal, and the first output terminal of the first power amplifier, a second output connector disposed adjacent to the second output terminal of the second power amplifier, a second input connector disposed of adjacent to the second input terminal of the second power amplifier, a second output lead connecting the second output terminal and the second output connector, and a second input lead connecting the second input terminal and the second input connector; and a heat sink having a first flank abutted on the first heat radiation surface of the first power amplification unit, and a second flank abutted on the second heat radiation surface of the second power amplification unit.

2. The power amplification device according to claim 1, wherein the first input lead having a first input length and the second input lead having a second input length, and the first output lead having a first output length and the second output lead having a second output length;

wherein the second input length is the same as the first input length, and the second output length is the same as the first output length.

3. The power amplification device according to claim 1, wherein a first phase of a first signal passing through the first power amplification unit is equal to a second phase of a second signal passing through the second power amplification unit.

4. The power amplification device according to claim 1, wherein the first power amplifier and the second power amplifier are identical to each other.

* * * * *